(12) United States Patent  (10) Patent No.: US 7,547,905 B2
Gilton  (45) Date of Patent: *Jun. 16, 2009

(54) PROGRAMMABLE CONDUCTOR MEMORY CELL STRUCTURE AND METHOD THEREFOR

(75) Inventor: Terry L. Gilton, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 223 days.

This patent is subject to a terminal disclaimer.

(21) Appl. No.: 11/435,824

(22) Filed: May 18, 2006

(65) Prior Publication Data

US 2006/0208249 A1  Sep. 21, 2006

Related U.S. Application Data

(60) Division of application No. 10/787,123, filed on Feb. 27, 2004, now Pat. No. 7,132,675, which is a continuation of application No. 10/121,790, filed on Apr. 10, 2002, now Pat. No. 6,864,500.

(51) Int. Cl.
*H01L 47/00*  (2006.01)
(52) U.S. Cl. .................................. 257/3; 257/E45.002
(58) Field of Classification Search .................. 257/2–4, 257/E45.002
See application file for complete search history.

(56) References Cited

U.S. PATENT DOCUMENTS

| 3,271,591 | A | 9/1966 | Ovshinsky |
| 3,622,319 | A | 11/1971 | Sharp |
| 3,743,847 | A | 7/1973 | Boland |
| 3,961,314 | A | 6/1976 | Klose et al. |
| 3,966,317 | A | 6/1976 | Wacks et al. |

(Continued)

FOREIGN PATENT DOCUMENTS

JP  56126916  10/1981

(Continued)

OTHER PUBLICATIONS

Abdel-All, A.; Elshafie, A.; Elhawary, M.M., DC electric-field effect in bulk and thin-film Ge5As38Te57 chalcogenide glass, Vacuum 59 (2000) 845-853.

(Continued)

*Primary Examiner*—David Vu
(74) *Attorney, Agent, or Firm*—Dickstein Shapiro LLP

(57) ABSTRACT

In programmable conductor memory cells, metal ions precipitate out of a glass electrolyte element in response to an applied electric field in one direction only, causing a conductive pathway to grow from cathode to anode. The amount of conductive pathway growth, and therefore the programming, depends, in part, on the availability of metal ions. It is important that the metal ions come only from the solid solution of the memory cell body. If additional metal ions are supplied from other sources, such as the sidewall edge at the anode interface, the amount of metal ions may not be directly related to the strength of the electric field, and the programming will not respond consistently from cell to cell. The embodiments described herein provide new and novel structures that block interface diffusion paths for metal ions, leaving diffusion from the bulk glass electrolyte as the only supply of metal ions for conductive pathway formation.

20 Claims, 7 Drawing Sheets

U.S. PATENT DOCUMENTS

| | | |
|---|---|---|
| 3,983,542 A | 9/1976 | Ovshinsky |
| 3,988,720 A | 10/1976 | Ovshinsky |
| 4,177,474 A | 12/1979 | Ovshinsky |
| 4,267,261 A | 5/1981 | Hallman et al. |
| 4,269,935 A | 5/1981 | Masters et al. |
| 4,312,938 A | 1/1982 | Drexler et al. |
| 4,316,946 A | 2/1982 | Masters et al. |
| 4,320,191 A | 3/1982 | Yoshikawa et al. |
| 4,405,710 A | 9/1983 | Balasubramanyam et al. |
| 4,419,421 A | 12/1983 | Wichelhaus et al. |
| 4,499,557 A | 2/1985 | Holmberg et al. |
| 4,597,162 A | 7/1986 | Johnson et al. |
| 4,608,296 A | 8/1986 | Keem et al. |
| 4,637,895 A | 1/1987 | Ovshinsky et al. |
| 4,646,266 A | 2/1987 | Ovshinsky et al. |
| 4,664,939 A | 5/1987 | Ovshinsky |
| 4,668,968 A | 5/1987 | Ovshinsky et al. |
| 4,670,763 A | 6/1987 | Ovshinsky et al. |
| 4,671,618 A | 6/1987 | Wu et al. |
| 4,673,957 A | 6/1987 | Ovshinsky et al. |
| 4,678,679 A | 7/1987 | Ovshinsky |
| 4,696,758 A | 9/1987 | Ovshinsky et al. |
| 4,698,234 A | 10/1987 | Ovshinsky et al. |
| 4,710,899 A | 12/1987 | Young et al. |
| 4,728,406 A | 3/1988 | Banerjee et al. |
| 4,737,379 A | 4/1988 | Hudgens et al. |
| 4,766,471 A | 8/1988 | Ovshinsky et al. |
| 4,769,338 A | 9/1988 | Ovshinsky et al. |
| 4,775,425 A | 10/1988 | Guha et al. |
| 4,788,594 A | 11/1988 | Ovshinsky et al. |
| 4,795,657 A | 1/1989 | Formigoni et al. |
| 4,800,526 A | 1/1989 | Lewis |
| 4,809,044 A | 2/1989 | Pryor et al. |
| 4,818,717 A | 4/1989 | Johnson et al. |
| 4,843,443 A | 6/1989 | Ovshinsky et al. |
| 4,845,533 A | 7/1989 | Pryor et al. |
| 4,847,674 A | 7/1989 | Sliwa et al. |
| 4,853,785 A | 8/1989 | Ovshinsky et al. |
| 4,891,330 A | 1/1990 | Guha et al. |
| 5,128,099 A | 7/1992 | Strand et al. |
| 5,159,661 A | 10/1992 | Ovshinsky et al. |
| 5,166,758 A | 11/1992 | Ovshinsky et al. |
| 5,177,567 A | 1/1993 | Klersy et al. |
| 5,219,788 A | 6/1993 | Abernathey et al. |
| 5,238,862 A | 8/1993 | Blalock et al. |
| 5,272,359 A | 12/1993 | Nagasubramanian et al. |
| 5,296,716 A | 3/1994 | Ovshinsky et al. |
| 5,314,772 A | 5/1994 | Kozicki |
| 5,315,131 A | 5/1994 | Kishimoto et al. |
| 5,335,219 A | 8/1994 | Ovshinsky et al. |
| 5,341,328 A | 8/1994 | Ovshinsky et al. |
| 5,350,484 A | 9/1994 | Gardner et al. |
| 5,359,205 A | 10/1994 | Ovshinsky |
| 5,360,981 A | 11/1994 | Owen et al. |
| 5,406,509 A | 4/1995 | Ovshinsky et al. |
| 5,414,271 A | 5/1995 | Ovshinsky et al. |
| 5,500,532 A | 3/1996 | Kozicki et al. |
| 5,512,328 A | 4/1996 | Yoshimura et al. |
| 5,512,773 A | 4/1996 | Wolf et al. |
| 5,534,711 A | 7/1996 | Ovshinsky et al. |
| 5,534,712 A | 7/1996 | Ovshinsky et al. |
| 5,536,947 A | 7/1996 | Klersy et al. |
| 5,543,737 A | 8/1996 | Ovshinsky |
| 5,591,501 A | 1/1997 | Ovshinsky et al. |
| 5,596,522 A | 1/1997 | Ovshinsky et al. |
| 5,687,112 A | 11/1997 | Ovshinsky |
| 5,694,054 A | 12/1997 | Ovshinsky et al. |
| 5,714,768 A | 2/1998 | Ovshinsky et al. |
| 5,726,083 A | 3/1998 | Takaishi |
| 5,751,012 A | 5/1998 | Wolstenholme et al. |
| 5,761,115 A | 6/1998 | Kozicki et al. |
| 5,789,277 A | 8/1998 | Zahorik et al. |
| 5,814,527 A | 9/1998 | Wolstenholme et al. |
| 5,818,749 A | 10/1998 | Harshfield |
| 5,825,046 A | 10/1998 | Czubatyj et al. |
| 5,841,150 A | 11/1998 | Gonzalez et al. |
| 5,846,889 A | 12/1998 | Harbison et al. |
| 5,851,882 A | 12/1998 | Harshfield |
| 5,869,843 A | 2/1999 | Harshfield |
| 5,896,312 A | 4/1999 | Kozicki et al. |
| 5,912,839 A | 6/1999 | Ovshinsky et al. |
| 5,914,893 A | 6/1999 | Kozicki et al. |
| 5,920,788 A | 7/1999 | Reinberg |
| 5,933,365 A | 8/1999 | Klersy et al. |
| 5,998,066 A | 12/1999 | Block et al. |
| 6,011,757 A | 1/2000 | Ovshinsky |
| 6,031,287 A | 2/2000 | Harshfield |
| 6,072,716 A | 6/2000 | Jacobson et al. |
| 6,077,729 A | 6/2000 | Harshfield |
| 6,084,796 A | 7/2000 | Kozicki et al. |
| 6,087,674 A | 7/2000 | Ovshinsky et al. |
| 6,117,720 A | 9/2000 | Harshfield |
| 6,141,241 A | 10/2000 | Ovshinsky et al. |
| 6,143,604 A | 11/2000 | Chiang et al. |
| 6,177,338 B1 | 1/2001 | Liaw et al. |
| 6,236,059 B1 | 5/2001 | Wolsteinholme et al. |
| RE37,259 E | 7/2001 | Ovshinsky |
| 6,297,170 B1 | 10/2001 | Gabriel et al. |
| 6,300,684 B1 | 10/2001 | Gonzalez et al. |
| 6,316,784 B1 | 11/2001 | Zahorik et al. |
| 6,329,606 B1 | 12/2001 | Freyman et al. |
| 6,337,266 B1 * | 1/2002 | Zahorik ..................... 438/618 |
| 6,339,544 B1 | 1/2002 | Chiang et al. |
| 6,348,365 B1 | 2/2002 | Moore et al. |
| 6,350,679 B1 | 2/2002 | McDaniel et al. |
| 6,376,284 B1 | 4/2002 | Gonzalez et al. |
| 6,388,324 B2 | 5/2002 | Kozicki et al. |
| 6,391,688 B1 | 5/2002 | Gonzalez et al. |
| 6,404,665 B1 | 6/2002 | Lowery et al. |
| 6,414,376 B1 | 7/2002 | Thakur et al. |
| 6,418,049 B1 | 7/2002 | Kozicki et al. |
| 6,420,725 B1 | 7/2002 | Harshfield |
| 6,423,628 B1 | 7/2002 | Li et al. |
| 6,429,064 B1 | 8/2002 | Wicker |
| 6,437,383 B1 | 8/2002 | Xu |
| 6,440,837 B1 | 8/2002 | Harshfield |
| 6,462,984 B1 | 10/2002 | Xu et al. |
| 6,469,364 B1 | 10/2002 | Kozicki |
| 6,473,332 B1 | 10/2002 | Ignatiev et al. |
| 6,480,438 B1 | 11/2002 | Park |
| 6,487,106 B1 | 11/2002 | Kozicki |
| 6,487,113 B1 | 11/2002 | Park et al. |
| 6,501,111 B1 | 12/2002 | Lowery |
| 6,507,061 B1 | 1/2003 | Hugdens et al. |
| 6,511,862 B2 | 1/2003 | Hudgens et al. |
| 6,511,867 B2 | 1/2003 | Lowery et al. |
| 6,512,241 B1 | 1/2003 | Lai |
| 6,514,805 B2 | 2/2003 | Xu et al. |
| 6,531,373 B2 | 3/2003 | Gill et al. |
| 6,534,781 B2 | 3/2003 | Dennison |
| 6,545,287 B2 | 4/2003 | Chiang |
| 6,545,907 B1 | 4/2003 | Lowery et al. |
| 6,555,860 B2 | 4/2003 | Lowery et al. |
| 6,563,164 B2 | 5/2003 | Lowery et al. |
| 6,566,700 B2 | 5/2003 | Xu |
| 6,567,293 B1 | 5/2003 | Lowery et al. |
| 6,569,705 B2 | 5/2003 | Chiang et al. |
| 6,570,784 B2 | 5/2003 | Lowery |
| 6,576,921 B2 | 6/2003 | Lowery |
| 6,586,761 B2 | 7/2003 | Lowery |
| 6,589,714 B2 | 7/2003 | Maimon et al. |
| 6,590,807 B2 | 7/2003 | Lowery |
| 6,593,176 B2 | 7/2003 | Dennison |
| 6,597,009 B2 | 7/2003 | Wicker |

| Patent | Date | Inventor |
|---|---|---|
| 6,605,527 B2 | 8/2003 | Dennison et al. |
| 6,613,604 B2 | 9/2003 | Maimon et al. |
| 6,621,095 B2 | 9/2003 | Chiang et al. |
| 6,625,054 B2 | 9/2003 | Lowery et al. |
| 6,642,102 B2 | 11/2003 | Xu |
| 6,646,297 B2 | 11/2003 | Dennison |
| 6,649,928 B2 | 11/2003 | Dennison |
| 6,667,900 B2 | 12/2003 | Lowery et al. |
| 6,671,710 B2 | 12/2003 | Ovshinsky et al. |
| 6,673,648 B2 | 1/2004 | Lowery |
| 6,673,700 B2 | 1/2004 | Dennison et al. |
| 6,674,115 B2 | 1/2004 | Hudgens et al. |
| 6,687,153 B2 | 2/2004 | Lowery |
| 6,687,427 B2 | 2/2004 | Ramalingam et al. |
| 6,690,026 B2 | 2/2004 | Peterson |
| 6,696,355 B2 | 2/2004 | Dennison |
| 6,707,712 B2 | 3/2004 | Lowery |
| 6,714,954 B2 | 3/2004 | Ovshinsky et al. |
| 6,864,500 B2 * | 3/2005 | Gilton ............................ 257/2 |
| 2002/0000666 A1 | 1/2002 | Kozicki et al. |
| 2002/0072188 A1 | 6/2002 | Gilton |
| 2002/0106849 A1 | 8/2002 | Moore |
| 2002/0123169 A1 | 9/2002 | Moore et al. |
| 2002/0123170 A1 | 9/2002 | Moore et al. |
| 2002/0123248 A1 | 9/2002 | Moore et al. |
| 2002/0127886 A1 | 9/2002 | Moore et al. |
| 2002/0132417 A1 | 9/2002 | Li |
| 2002/0160551 A1 | 10/2002 | Harshfield |
| 2002/0163828 A1 | 11/2002 | Krieger et al. |
| 2002/0168820 A1 | 11/2002 | Kozicki et al. |
| 2002/0168852 A1 | 11/2002 | Harshfield et al. |
| 2002/0190289 A1 | 12/2002 | Harshfield et al. |
| 2002/0190350 A1 | 12/2002 | Kozicki et al. |
| 2003/0001229 A1 | 1/2003 | Moore et al. |
| 2003/0027416 A1 | 2/2003 | Moore |
| 2003/0032254 A1 | 2/2003 | Gilton |
| 2003/0035314 A1 | 2/2003 | Kozicki |
| 2003/0035315 A1 | 2/2003 | Kozicki |
| 2003/0038301 A1 | 2/2003 | Moore |
| 2003/0043631 A1 | 3/2003 | Gilton et al. |
| 2003/0045049 A1 | 3/2003 | Campbell et al. |
| 2003/0045054 A1 | 3/2003 | Campbell et al. |
| 2003/0047765 A1 | 3/2003 | Campbell |
| 2003/0047772 A1 | 3/2003 | Li |
| 2003/0047773 A1 | 3/2003 | Li |
| 2003/0048519 A1 | 3/2003 | Kozicki |
| 2003/0048744 A1 | 3/2003 | Ovshinsky et al. |
| 2003/0049912 A1 | 3/2003 | Campbell et al. |
| 2003/0068861 A1 | 4/2003 | Li |
| 2003/0068862 A1 | 4/2003 | Li |
| 2003/0095426 A1 | 5/2003 | Hush et al. |
| 2003/0096497 A1 | 5/2003 | Moore et al. |
| 2003/0107105 A1 | 6/2003 | Kozicki |
| 2003/0117831 A1 | 6/2003 | Hush |
| 2003/0128612 A1 | 7/2003 | Moore et al. |
| 2003/0137869 A1 | 7/2003 | Kozicki |
| 2003/0143782 A1 | 7/2003 | Gilton et al. |
| 2003/0155589 A1 | 8/2003 | Campbell et al. |
| 2003/0155606 A1 | 8/2003 | Campbell et al. |
| 2003/0156447 A1 | 8/2003 | Kozicki |
| 2003/0156463 A1 | 8/2003 | Casper et al. |
| 2003/0209728 A1 | 11/2003 | Kozicki et al. |
| 2003/0209971 A1 | 11/2003 | Kozicki et al. |
| 2003/0210564 A1 | 11/2003 | Kozicki et al. |
| 2003/0212724 A1 | 11/2003 | Ovshinsky et al. |
| 2003/0212725 A1 | 11/2003 | Ovshinsky et al. |
| 2004/0035401 A1 | 2/2004 | Ramachandran et al. |

FOREIGN PATENT DOCUMENTS

| | | |
|---|---|---|
| WO | WO 97/48032 | 12/1997 |
| WO | WO 99/28914 | 6/1999 |
| WO | WO 00/48196 | 8/2000 |
| WO | WO 02/21542 A1 | 3/2002 |

OTHER PUBLICATIONS

Alder, D.; Moss, S.C., Amorphous memories and bistable switches, J. Vac. Sci. Technol. 9 (1972) 1182-1189.

Adler, D.; Henisch, H.K.; Mott, S.N., The mechanism of threshold switching in amorphous alloys, Rev. Mod. Phys. 50 (1978) 209-220.

Afifi, M.A.; Labib, H.H.; El-Fazary, M.H.; Fadel, M., Electrical and thermal properties of chalcogenide glass system Se75Ge25-xSbx, Appl. Phys. A 55 (1992) 167-169.

Afifi, M.A.; Labib, H.H.; Fouad, S.S.; El-Shazly, A.A., Electrical & thermal conductivity of the amorphous semiconductor GexSe1-x, Egypt, J. Phys. 17 (1986) 335-342.

Alekperova, Sh.M.; Gadzhieva, G.S., Current-Voltage characteristics of Ag2Se single crystal near the phase transitiion, Inorganic Materials 23 (1987) 137-139.

Aleksiejunas, A.; Cesnys, A., Switching phenomenon and memory effect in thin-film heterojunction of polycrystalline selenium-silver selenide, Phys. Stat. Sol. (a) 19 (1973) K169-K171.

Angell, C.A., Mobile ions in amorphous solids, Annu. Rev. Phys. Chem. 43 (1992) 693-717.

Aniya, M., Average electronegativity, medium-range-order, and ionic conductivity in superionic glasses, Solid state Ionics 136-137 (2000) 1085-1089.

Asahara, Y.; Izumitani, T., Voltage controlled switching in Cu-As-Se compositions, J. Non-Cryst. Solids 11 (1972) 97-104.

Asokan, S.; Prasad, M.V.N.; Parthasarathy, G.; Gopal, E.S.R., Mechanical and chemical thresholds in IV-VI chalcogenide glasses, Phys. Rev. Lett. 62 (1989) 808-810.

Axon Technologies Corporation, Technology Description: *Programmable Metalization Cell(PMC)*, pp. 1-6 (Pre-May 2000).

Baranovskii, S.D.; Cordes, H., On the conduction mechanism in ionic glasses, J. Chem. Phys. 111 (1999) 7546-7557.

Belin, R.; Taillades, G.; Pradel, A.; Ribes, M., Ion dynamics in superionic chalcogenide glasses: complete conductivity spectra, Solid state Ionics 136-137 (2000) 1025-1029.

Belin, R.; Zerouale, A.; Pradel, A.; Ribes, M., Ion dynamics in the argyrodite compound Ag7GeSe5I: non-Arrhenius behavior and complete conductivity spectra, Solid State Ionics 143 (2001) 445-455.

Benmore, C.J.; Salmon, P.S., Structure of fast ion conducting and semiconducting glassy chalcogenide alloys, Phys. Rev. Lett. 73 (1994) 264-267.

Bernede, J.C., Influence du metal des electrodes sur les caracteristiques courant-tension des structures M-Ag2Se-M, Thin solid films 70 (1980) L1-L4.

Bernede, J.C., Polarized memory switching in MIS thin films, Thin Solid Films 81 (1981) 155-160.

Bernede, J.C., Switching and silver movements in Ag2Se thin films, Phys. Stat. Sol. (a) 57 (1980) K101-K104.

Bernede, J.C.; Abachi, T., Differential negative resistance in metal/insulator/metal structures with an upper bilayer electrode, Thin solid films 131 (1985) L61-L64.

Bernede, J.C.; Conan, A.; Fousenan't, E.; El Bouchairi, B.; Goureaux, G., Polarized memory switching effects in Ag2Se/Se/M thin film sandwiches, Thin solid films 97 (1982) 165-171.

Bernede, J.C. et al., Transition from S- to N-type differential negative resistance in Al-Al2O3-Ag2-xSe1+x thin film structures, Phys.Stat. Sol. (a) 74 (1982) 217-224.

Bondarev, V.N.; Pikhitsa, P.V., A dendrite model of current instability in RbAg4I5, Solid State Ionics 70/71 (1994) 72-76.

Boolchand, P., The maximum in glass transition temperature (Tg) near x=1/3 in GexSe1-x Glasses, Asian Journal of Physics (2000) 9, 709-72.

Boolchand, P.; Georgiev, D.G.; Goodman, B., Discovery of the Intermediate Phase in Chalcogenide Glasses, J. Optoelectronics and Advanced Materials, 3 (2001), 703.

Boolchand, P.; Selvanathan, D.; Wang, Y.; Georgiev, D.G.; Bresser, W.J., Onset of rigidity in steps in chalcogenide glasses, Properties and Applications of Amorphous Materials, M.F. Thorpe and Tichy, L. (eds.) Kluwer Academic Publishers, the Netherlands, 2001, pp. 97-132.

Boolchand, P.; Enzweiler, R.N.; Tenhover, M., Structural ordering of evaporated amorphous chalcogenide alloy films: role of thermal annealing, Diffusion and Defect Data vol. 53-54 (1987) 415-420.

Boolchand, P.; Grothaus, J.; Bresser, W.J.; Suranyi, P., Structural origin of broken chemical order in a GeSe2 glass, Phys. Rev. B 25 (1982) 2975-2978.

Boolchand, P.; Grothaus, J.; Phillips, J.C., Broken chemical order and phase separation in GeSe1-x glasses, Solid state comm. 45 (1983) 183-185.

Boolchand, P., Bresser, W.J., Compositional trends in glass transition temperature (Tg), network connectivity and nanoscale chemical phase separation in chalcogenides, Dept. of ECECS, Univ. Cincinnati (Oct. 28, 1999) 45221-0030.

Boolchand, P.; Grothaus, J, Molecular Structure of Melt-Quenched GeSe2 and GeS2 glasses compared, Proc. Int. Conf. Phys. Semicond. (Eds. Chadi and Harrison) $17^{th}$ (1985) 833-36.

Bresser, W.; Boolchand, P.; Suranyi, P., Rigidity percolation and molecular clustering in network glasses, Phys. Rev. Lett. 56 (1986) 2493-2496.

Bresser, W.J.; Boolchand, P.; Suranyi, P.; de Neufville, J.P, Intrinsically broken chalcogen chemical order in stoichiometric glasses, Journal de Physique 42 (1981) C4-193-C4-196.

Bresser, W.J.; Boolchand, P.; Suranyi, P.; Hernandez, J.G., Molecular phase separation and cluster size in GeSe2 glass, Hyperfine Interactions 27 (1986) 389-392.

Cahen, D.; Gilet, J.-M.; Schmitz, C.; Chernyak, L.; Gartsman, K.; Jakubowicz, A., Room-Temperature, electric field induced creation of stable devices in CuInSe2 Crystals, Science 258 (1992) 271-274.

Chatterjee, R.; Asokan, S.; Titus, S.S.K., Current-controlled negative-resistance behavior and memory switching in bulk As-Te-Se glasses, J. Phys. D: Appl. Phys. 27 (1994) 2624-2627.

Chen, C.H.; Tai, K.L., Whisker growth induced by Ag photodoping in glassy GexSe1-x films, Appl. Phys. Lett. 37 (1980) 1075-1077.

Chen, G.; Cheng, J., Role of nitrogen in the crystallization of silicon nitride-doped chalcogenide glasses, J. Am. Ceram. Soc. 82 (1999) 2934-2936.

Chen, G.; Cheng, J.; Chen, W., Effect of Si3N4 on chemical durability of chalcogenide glass, J. Non-Cryst. Solids 220 (1997) 249-253.

Cohen, M.H.; Neale, R.G.; Paskin, A., A model for an amorphous semiconductor memory device, J. Non-Cryst. Solids 8-10 (1972) 885-891.

Croitoru, N.;Lazarescu, M.; Popescu, C.; Telnic, M.; and Vescan, L., Ohmic and non-ohmic conduction in some amorphous semiconductors, J. Non-Cryst. Solids 8-10 (1972) 781-786.

Dalven, R.; Gill, R., Electrical properties of beta-Ag2Te and beta-Ag2Se from 4.2 to 300K, J. Appl. Phys. 38 (1967) 753-756.

Davis, E.A., Semiconductors without form, Search 1 (1970) 152-155.

Dearnaley, G.; Stoneham, A.M.; Morgan, D.V., Electrical phenomena in amorphous oxide films, Rep. Prog. Phys. 33 (1970) 1129-1191.

Dejus, R.J.; Susman, S.; Volin, K.J.; Montague, D.G.; Price, D.L., Structure of Vitreous Ag-Ge-Se, J. Non-Cryst. Solids 143 (1992) 162-180.

den Boer, W., Threshold switching in hydrogenated amorphous silicon, Appl. Phys. Lett. 40 (1982) 812-813.

Drusedau, T.P.; Panckow, A.N.; Klabunde, F., The hydrogenated amorphous silicon/nanodisperse metal (SIMAL) systems-Films of unique electronics properties, J. Non-Cryst. Solids 198-200 (1996) 829-832.

El Bouchairi, B.; Bernede, J.C.; Burgaud, P., Properties of Ag2-xSe1+x/n-Si diodes, Thin Solid Films 110 (1983) 107-113.

El Gharras, Z.; Bourahla, A.; Vautier, C., Role of photoinduced defects in amorphous GexSe1-x photoconductivity, J. Non-Cryst. Solids 155 (1993) 171-179.

El Ghrandi, R.; Calas, J.; Galibert, G.; Averous, M., Silver photodissolution in amorphous chalcogenide thin films, Thin Solid Films 218 (1992)259-273.

El Ghrandi, R.; Calas, J.; Galibert, G., Ag dissolution kinetics in amporphous GeSe5.5 thin films from "in-situ" resistance measurements vs time, Phys. Stat. Sol. (a) 123 (1991) 451-460.

El-kady, Y.L., The threshold switching in semiconducting glass Ge21Se17Te62, Indian J. Phys. 70A (1996) 507-516.

Elliott, S.R., A unified mechanism for metal photodissolution in amporphous chalcogenide materials, J. Non-Cryst. Solids 130 (1991) 85-97.

Elliott, S.R., Photodissolution of metals in chalcogenide glasses: A unified mechanism, J. Non-Cryst. Solids 137-138 (1991) 1031-1034.

Elsamanoudy, M.M.; Hegab, N.A.; Fadel, M., Conduction mechanism in the pre-switching state of thin films containing Te As Ge Si, Vacuum 46 (1995) 701-707.

El-Zahed, H.; El-Korashy, A., Influence of composition on the electrical and optical properties of Ge20BixSe80-x films, Thin Solid Films 376 (2000) 236-240.

Fadel, M., Switching phenomenon in evaporated Se-Ge-As thin films of amorphous chalcogenide glass, Vacuum 44 (1993) 851-855.

Fadel, M.; El-Shair, H.T., Electrical, thermal and optical properties of Se75Ge7Sb18, Vacuum 43 (1992) 253-257.

Feng, X. ;Bresser, W.J.; Boolchand, P., Direct evidence for stiffness threshold in Chalcogenide glasses, Phys. Rev. Lett. 78 (1997) 4422-4425.

Feng, X.; Bresser, W.J.; Zhang, M.; Goodman, B.; Boolchand, P., Role of network connectivity on the elastic, plastic and thermal behavior of covalent glasses, J. Non-Cryst. Solids 222 (1997) 137-143.

Fischer-Colbrie, A.; Bienenstock, A.; Fuoss, P.H.; Marcus, M.A., Structure and bonding in photodiffused amorphous Ag-GeSe2 thin films, Phys. Rev. B 38 (1988) 12388-12403.

Fleury, G.; Hamou, A.; Viger, C.; Vautier, C., Conductivity and crystallization of amorphous selenium, Phys. Stat. Sol. (a) 64 (1981) 311-316.

Fritzsche, H, Optical and electrical energy gaps in amorphous semiconductors, J. Non-Cryst. Solids 6 (1971) 49-71.

Fritzsche, H., Electronic phenomena in amorphous semiconductors, Annual Review of Materials Science 2 (1972) 697-744.

Gates, B.; Wu, Y.; Yin, Y.; Yang, P.; Xia, Y., Single-crystalline nanowires of Ag2Se can be synthesized by templating against nanowires of trigonal Se, J. Am. Chem. Soc. (2001) currently ASAP.

Gosain, D.P.; Nakamura, M.; Shimizu, T.; Suzuki, M.; Okano, S., Nonvolatile memory based on reversible phase transition phenomena in telluride glasses, Jap. J. Appl. Phys. 28 (1989) 1013-1018.

Guin, J.-P.; Rouxel, T.; Keryvin, V.; Sangleboeuf, J.-C.; Serre, I.; Lucas, J., Indentation creep of Ge-Se chalcogenide glasses below Tg: elastic recovery and non-Newtonian flow, J. Non-Cryst. Solids 298 (2002) 260-269.

Guin, J.-P.; Rouxel, T.; Sangleboeuf, J.-C.; Melscoet, I.; Lucas, J., Hardness, toughness, and scratchability of germanium-selenium chalcogenide glasses, J. Am. Ceram. Soc. 85 (2002) 1545-52.

Gupta, Y.P., On electrical switching and memory effects in amorphous chalcogenides, J. Non-Cryst. Sol. 3 (1970) 148-154.

Haberland, D.R.; Stiegler, H., New experiments on the charge-controlled switching effect in amorphous semiconductors, J. Non-Cryst. Solids 8-10 (1972) 408-414.

Haifz, M.M.; Ibrahim, M.M.; Dongol, M.; Hammad, F.H., Effect of composition on the structure and electrical properties of As-Se-Cu glasses, J. Apply. Phys. 54 (1983) 1950-1954.

Hajto, J.; Rose, M.J.; Osborne, I.S.; Snell, A.J.; Le Comber, P.G.; Owen, A.E., Quantization effects in metal/a-Si:H/metal devices, Int. J. Electronics 73 (1992) 911-913.

Hajto, J.; Hu, J.; Snell, A.J.; Turvey, K.; Rose, M., DC and AC measurements on metal/a-Si:H/metal room temperature quantised resistance devices, J. Non-Cryst. Solids 266-269 (2000) 1058-1061.

Hajto, J.; McAuley, B.; Snell, A.J.; Owen, A.E., Theory of room temperature quantized resistance effects in metal-a-Si:H-metal thin film structures, J. Non-Cryst. Solids 198-200 (1996) 825-828.

Hajto, J.; Owen, A.E.; Snell, A.J.; Le Comber, P.G.; Rose, M.J., Analogue memory and ballistic electron effects in metal-amorphous silicon structures, Phil. Mag. B 63 (1991) 349-369.

Hayashi, T.; Ono, Y.; Fukaya, M.; Kan, H., Polarized memory switching in amorphous Se film, Japan. J. Appl. Phys. 13 (1974) 1163-1164.

Hegab, N.A.; Fadel, M.; Sedeek, K., Memory switching phenomena in thin films of chalcogenide semiconductors, Vacuum 45 (1994) 459-462.

Helbert et al., *Intralevel hybrid resist process with submicron capability*, SPIE vol. 333 Submicron Lithography, pp. 24-29 (1982).

Hilt, Dissertation: *Materials characterization of Silver Chalcogenide Programmable Metalization Cells*, Arizona State University, pp. Title page-114 (UMI Company, May 1999).

Holmquist et al., *Reaction and Diffusion in Silver-Arsenic Chalcogenide Glass Systems*, 62 J. Amer. Ceram. Soc., No. 3-4, pp. 183-188 (Mar.- Apr. 1979).

Hong, K.S.; Speyer, R.F., Switching behavior in II-IV-V2 amorphous semiconductor systems, J. Non-Cryst. Solids 116 (1990) 191-200.

Hosokawa, S., Atomic and electronic structures of glassy GexSe1-x around the stiffness threshold composition, J. Optoelectronics and Advanced Materials 3 (2001) 199-214.

Hu, J.; Snell, A.J.; Hajto, J.; Owen, A.E., Constant current forming in Cr/p+a-/Si:H/V thin film devices, J. Non-Cryst. Solids 227-230 (1998) 1187-1191.

Hu, J.; Hajto, J.; Snell, A.J.; Owen, A.E.; Rose, M.J., Capacitance anomaly near the metal-non-metal transition in Cr-hydrogenated amorphous Si-V thin-film devices, Phil. Mag. B. 74 (1996) 37-50.

Hu, J.; Snell, A.J.; Hajto, J.; Owen, A.E., Current-induced instability in Cr-p+a-Si:H-V thin film devices, Phil. Mag. B 80 (2000) 29-43.

Huggett et al., Development of silver sensitized germanium selenide photoresist by reactive sputter etching in SF6, 42 Appl. Phys. Lett., No. 7, pp. 592-594 (Apr. 1983).

Iizima, S.; Sugi, M.; Kikuchi, M.; Tanaka, K., Electrical and thermal properties of semiconducting glasses As-Te-Ge, Solid State Comm. 8 (1970) 153-155.

Ishikawa, R.; Kikuchi, M., Photovoltaic study on the photo-enhanced diffusion of Ag in amorphous films of Ge2S3, J. Non-Cryst. Solids 35 & 36 (1980) 1061-1066.

Iyetomi, H.; Vashishta, P.; Kalia, R.K., Incipient phase separation in Ag/Ge/Se glasses: clustering of Ag atoms, J. Non-Cryst. Solids 262 (2000) 135-142.

Jones, G.; Collins, R.A., Switching properties of thin selenium films under pulsed bias, Thin Solid Films 40 (1977) L15-L18.

Joullie, A.M.; Marucchi, J., On the DC electrical conduction of amorphous As2Se7 before switching, Phys. Stat. Sol. (a) 13 (1972) K105-K109.

Joullie, A.M.; Marucchi, J., Electrical properties of the amorphous alloy As2Se5, Mat. Res. Bull. 8 (1973) 433-422.

Kaplan, T.; Adler, D., Electrothermal switching in amorphous semiconductors, J. Non-Cryst. Solids 8-10 (1972) 538-543.

Kawaguchi et al., *Mechanism of photosurface deposition*, 164-166 J. Non-Cryst. Solids, pp. 1231-1234 (1993).

Kawaguchi, T.; Maruno, S.; Elliot, S.R., Optical, electrical, and structural properties of amorphous Ag-Ge-S and Ag-Ge-Se films and comparison of photoinduced and thermally induced phenomena of both systems, J. Appl. Phys. 79 (1996) 9096-9104.

Kawaguchi, T.; Masui, K., Analysis of change in optical transmission spectra resulting from Ag photodoping in chalcogenide film, Japn. J. Appl. Phys. 26 (1987) 15-21.

Kawasaki, M.; Kawamura, J.; Nakamura, Y.; Aniya, M., Ionic conductivity of Agx(GeSe3) 1-x (0<=x <=0.571) glasses, Solid state Ionics 123 (1999) 259-269.

Kluge, G.; Thomas, A.; Klabes, R.; Grotzschel, R., Silver photodiffusion in amorphous GexSe100-x, J. Non-Cryst. Solids 124 (1990) 186-193.

Kolobov, A.V., On the origin of p-type conductivity in amorphous chalcogenides, J. Non-Cryst. Solids 198-200 (1996) 728-731.

Kolobov, A.V., Lateral diffusion of silver in vitreous chalcogenide films, J. Non-Cryst. Solids 137-138 (1991) 1027-1030.

Korkinova, Ts.N.; Andreichin, R.E., Chalcogenides glass polarization and the type of contacts, J. Non-Cryst. Solids 194 (1996) 256-259.

Kotkata, M.F.; Afif, M.A.; Labib, H.H.; Hegab, N.A.; Abdel-Aziz, M.M., Memory switching in amorphous GeSeTl chalcogenide semiconductor films, Thin Solid Films 240 (1994) 143-146.

Kozicki et al., Silver incorporation in thin films of selenium rich Ge-Se glasses, International Congress on Glass, vol. 2, Extended Abstracts, Jul. 2001. pp. 8-9.

Michael N. Kozicki, 1. Programmable Metallization Cell Technology Description, Feb. 18, 2000.

Michael N. Kozicki, Axon Technologies Corp. and Arizona State University, Presentation to Micron Technology, Inc., Apr. 6, 2000.

Kozicki et al., Applications of Programmable Resistance Changes In Metal-Doped Chalcogenides, Electrochemical Society Proceedings, vol. 99-13, 1999, pp. 298-309.

Kozicki et al., Nanoscale effects in devices based on chalcogenide solid solutions, Superlattices and Microstructures, vol. 27, No. 516, 2000, pp. 485-488.

Kozicki et al., Nanoscale phase separation in Ag-Ge-Se glasses, Microelectronic Engineering 63 (2002) pp. 155-159.

Lakshminarayan, K.N.; Srivastava, K.K.; Panwar, O.S.; Dumar, A., Amorphous semiconductor devices: memory and switching mechanism, J. Instn Electronics & Telecom. Engrs 27 (1981) 16-19.

Lal, M.; Goyal, N., Chemical bond approach to study the memory and threshold switching chalcogenide glasses, Indian Journal of pure & appl. phys. 29 (1991) 303-304.

Leimer, F.; Stotzel, H.; Kottwitz, A., Isothermal electrical polarisation of amorphous GeSe films with blocking Al contacts influenced by Poole-Frenkel conduction, Phys. Stat. Sol. (a) 29 (1975) K129-K132.

Leung, W.; Cheung, N.; Neureuther, A.R., Photoinduced diffusion of Ag in GexSe1-x glass, Appl. Phys. Lett. 46 (1985) 543-545.

Matsushita, T.; Yamagami, T.; Okuda, M., Polarized memory effect observed on Se-SnO2 system, Jap. J. Appl. Phys. 11 (1972) 1657-1662.

Matsushita, T.; Yamagami, T.; Okuda, M., Polarized memory effect observed on amorphous selenium thin films, Jpn. J. Appl. Phys. 11 (1972) 606.

Mazurier, F.; Levy, M.; Souquet, J.L, Reversible and irreversible electrical switching in TeO2-V2O5 based glasses, Journal de Physique IV 2 (1992) C2-185 - C2-188.

McHardy et al., The dissolution of metals in amorphous chalcogenides and the effects o electron and ultraviolet radiation, 20 J. Phys. C.: Solid State Phys., pp. 4055-4075 (1987)f.

Messoussi, R.; Bernede, J.C.; Benhida, S.; Abachi, T.; Latef, A., Electrical characterization of M/Se structures (M=Ni, Bi), Mat. Chem. And Phys. 28 (1991) 253-258.

Mitkova, M.; Boolchand, P., Microscopic origin of the glass forming tendency in chalcogenides and constraint theory, J. Non-Cryst. Solids 240 (1998) 1-21.

Mitkova, M.; Kozicki, M.N., Silver incorporation in Ge-Se glasses used in programmable metallization cell devices, J. Non-Cryst. Solids 299-302 (2002) 1023-1027.

Miyatani, S.-y., Electronic and ionic conduction in (AgxCu1-x)2Se, J. Phys. Soc. Japan 34 (1973) 423-432.

Miyatani, S.-y., Electrical properties of Ag2Se, J. Phys. Soc. Japan 13 (1958) 317.

Miyatani, S.-y., Ionic conduction in beta-Ag2Te and beta-Ag2Se, Journal Phys. Soc. Japan 14 (1959)996-1002.

Mott, N.F., Conduction in glasses containing transition metal ions, J. Non-Cryst. Solids 1 (1968) 1-17.

Nakayama, K.; Kitagawa, T.; Ohmura, M.; Suzuki, M., Nonvolatile memory based on phase transitions in chalcogenide thin films, Jpn. J. Appl. Phys. 32 (1993) 564-569.

Nakayama, K.; Kojima, K.; Hayakawa, F.; Imai, Y.; Kitagawa, A.; Suzuki, M., Submicron nonvolatile memory cell based on reversible phase transition in chalcogenide glasses, Jpn. J. Appl. Phys. 39 (2000) 6157-6161.

Nang, T.T.; Okuda, M.; Matsushita, T.; Yokota, S.; Suzuki, A., Electrical and optical parameters of GexSe1-x amorphous thin films, Jap. J. App. Phys. 15 (1976) 849-853.

Narayanan, R.A.; Asokan, S.; Kumar, A., Evidence concerning the effect of topology on electrical switching in chalcogenide network glasses, Phys. Rev. B 54 (1996) 4413-4415.

Neale, R.G.; Aseltine, J.A., The application of amorphous materials to computer memories, IEEE transactions on electron dev. Ed-20 (1973) 195-209.

Ovshinsky S.R.; Fritzsche, H., Reversible structural transformations in amorphous semiconductors for memory and logic, Mettalurgical transactions 2 (1971) 641-645.

Ovshinsky, S.R., Reversible electrical switching phenomena in disordered structures, Phys. Rev. Lett. 21 (1968) 1450-1453.

Owen, A.E.; LeComber, P.G.; Sarrabayrouse, G.; Spear, W.E., New amorphous-silicon electrically programmable nonvolatile switching device, IEE Proc. 129 (1982) 51-54.

Owen, A.E.; Firth, A.P.; Ewen, P.J.S., Photo-induced structural and physico-chemcial changes in amourphous chalcogenide semiconductors, Phil. Mag. B 52 (1985) 347-362.

Owen, A.E.; Le Comber, P.G.; Hajto, J.; Rose, M.J.; Snell, A.J., Switching in amorphous devices, Int. J. Electronics 73 (1992) 897-906.

Owen et al., Metal-Chalcogenide Photoresists for High Resolution Lithography and Sub-Micron Structures, Nanostructure Physics and Fabrication, pp. 447-451 (M. Reed ed. 1989).

Pearson, A.D.; Miller, C.E., Filamentary conduction in semiconducting glass diodes, App. Phys. Lett. 14 (1969) 280-282.

Pinto, R.; Ramanathan, K.V., Electric field induced memory switching in thin films of the chalcogenide system Ge-As-Se, Appl. Phys. Lett. 19 (1971) 221-223.

Popescu, C., The effect of local non-uniformities on thermal switching and high field behavior of structures with chalcogenide glasses, Solid-state electronics 18 (1975) 671-681.

Popescu, C.; Croitoru, N., The contribution of the lateral thermal instability to the switching phenomenon, J. Non-Cryst. Solids 8-10 (1972) 531-537.

Popov, A.I.; Geller, I.Kh.; Shemetova, V.K., Memory and threshold switching effects in amorphous selenium, Phys. Stat. Sol. (a) 44 (1977) K71-K73.

Prakash, S.; Asokan, S.; Ghare, D.B., Easily reversible memory switching in Ge-As-Te glasses, J. Phys. D: Appl. Phys. 29 (1996) 2004-2008.

Rahman, S.; Sivarama Sastry, G., Electronic switching in Ge-Bi-Se-Te glasses, Mat. Sci. and Eng. B12 (1992) 219-222.

Ramesh, K.; Asokan, S.; Sangunni, K.S.; Gopal, E.S.R., Electrical Switching in germanium telluride glasses doped with Cu and Ag, Appl. Phys. A 69 (1999) 421-425.

Rose,M.J.;Hajto,J.;Lecomber,P.G.;Gage,S.M.;Choi,W.K.;Snell,A.J.;Owen,A.E., Amorphous silicon analogue memory devices, J. Non-Cryst. Solids 115 (1989) 168-170.

Rose,M.J.;Snell,A.J.;Lecomber,P.G.;Hajto,J.;Fitzgerald,A.G.;Owen,A.E., Aspects of non-volatility in a -Si:H memory devices, Mat. Res. Soc. Symp. Proc. V 258, 1992, 1075-1080.

Schuocker, D.; Rieder, G., On the reliability of amorphous chalcogenide switching devices, J. Non-Cryst. Solids 29 (1978) 397-407.

Sharma, A.K.; Singh, B., Electrical conductivity measurements of evaporated selenium films in vacuum, Proc. Indian Natn. Sci. Acad. 46, A, (1980) 362-368.

Sharma, P., Structural, electrical and optical properties of silver selenide films, Ind. J. Of pure and applied phys. 35 (1997) 424-427.

Shimizu et al., *The Photo-Erasable Memory Switching Effect of Ag Photo-Doped Chalcogenide Glasses*, 46 B. Chem Soc. Japan, No. 12, pp. 3662-3365 (1973).

Snell, A.J.; Lecomber, P.G.; Hajto, J.; Rose, M.J.; Owen, A.E.; Osbome, I.L., Analogue memory effects in metal/a-Si:H/metal memory devices, J. Non-Cryst. Solids 137-138 (1991) 1257-1262.

Snell, A.J.; Hajto, J.;Rose, M.J.; Osbome, L.S.; Holmes, A.; Owen, A.E.; Gibson, R.A.G., Analogue memory effects in metal/a-Si:H/metal thin film structures, Mat. Res. Soc. Symp. Proc. V 297, 1993, 1017-1021.

Steventon, A.G., Microfilaments in amorphous chalcogenide memory devices, J. Phys. D: Appl. Phys. 8 (1975) L120-L122.

Steventon, A.G., The switching mechanisms in amorphous chalcogenide memory devices, J. Non-Cryst. Solids 21 (1976) 319-329.

Stocker, H.J., Bulk and thin film switching and memory effects in semiconducting chalcogenide glasses, App. Phys. Lett. 15 (1969) 55-57.

Tanaka, K., Ionic and mixed conductions in Ag photodoping process, Mod. Phys. Lett B 4 (1990) 1373-1377.

Tanaka, K.; Iizima, S.; Sugi, M.; Okada, Y.; Kikuchi, M., Thermal effects on switching phenomenon in chalcogenide amorphous semiconductors, Solid State Comm. 8 (1970) 387-389.

Thornburg, D.D., Memory switching in a Type I amorphous chalcogenide, J. Elect. Mat. 2 (1973) 3-15.

Thornburg, D.D., Memory switching in amorphous arsenic triselenide, J. Non-Cryst. Solids 11 (1972) 113-120.

Thornburg, D.D.; White, R.M., Electric field enhanced phase separation and memory switching in amorphous arsenic triselenide, Journal(??) (1972) 4609-4612.

Tichy, L.; Ticha, H., Remark on the glass-forming ability in GexSe1-x and AsxSe1-x systems, J. Non-Cryst. Solids 261 (2000) 277-281.

Titus, S.S.K.; Chatterjee, R.; Asokan, S., Electrical switching and short-range order in As-Te glasses, Phys. Rev. B 48 (1993) 14650-14652.

Tranchant,S.;Peytavin,S.;Ribes,M.;Flank,A.M.;Dexpert,H.;Lagarde,J.P., Silver chalcogenide glasses Ag-Ge-Se: Ionic conduction and exafs structural investigation, Transport-structure relations in fast ion and mixed conductors Proceedings of the 6th Riso International symposium. Sep. 9-13, 1985.

Tregouet, Y.; Bernede, J.C., Silver movements in Ag2Te thin films: switching and memory effects, Thin Solid Films 57 (1979) 49-54.

Uemura, O.; Kameda, Y.; Kokai, S.; Satow, T., Thermally induced crystallization of amorphous Ge0.4Se0.6, J. Non-Cryst. Solids 117-118 (1990) 219-221.

Uttecht, R.; Stevenson, H.; Sie, C.H.; Griener, J.D.; Raghavan, K.S., Electric field induced filament formation in As-Te-Ge glass, J. Non-Cryst. Solids 2 (1970) 358-370.

Viger, C.; Lefrancois, G.; Fleury, G., Anomalous behoviour of amorphous selenium films, J. Non-Crys. Solids 33 (1976) 267-272.

Vodenicharov, C.; Parvanov,S.; Petkov,P., Electrode-limited currents in the thin-film M-GeSe-M system, Mat. Chem. And Phys. 21 (1989) 447-454.

Wang, S.-J.; Misium, G.R.; Camp, J.C.; Chen, K.-L.; Tigelaar, H.L., High-performance Metal/silicide antifuse, IEEE electron dev. Lett. 13 (1992)471-472.

Weirauch, D.F., Threshold switching and thermal filaments in amorphous semiconductors, App. Phys. Lett. 16 (1970) 72-73.

West, W.C.; Sieradzki, K.; Kardynal, B.; Kozicki, M.N., Equivalent circuit modeling of the Ag|As0.24S0.36Ag0.40|Ag System prepared by photodissolution of Ag, J. Electrochem. Soc. 145 (1998) 2971-2974.

West, W.C., Electrically erasable non-volatile memory via electrochemical deposition of multifractal aggregates, Ph.D. Dissertation, ASU 1998.

Zhang, M.; Mancini, S.; Bresser, W.; Boolchand, P., Variation of glass transition temperature, Tg, with average coordination number, <m>, in network glasses: evidence of a threshold behavior in the slope |dTg/d<m>| at the rigidity percolation threshold (<m>=2.4), J. Non-Cryst. Solids 151 (1992) 149-154.

P. Boolchand, et al., "Mobile Silver Ions and Glass Formation in Solid Electrolytes", *Nature*, vol. 410, Apr. 2001, pp. 1070-1073.

Y. Hirose, et al., "High Speed Memory Behavior and Reliability of an Amorphous As2S3 Film Doped With Ag", *Physica Status Solidi*, vol. (a), No. 16, (1980) K187-K190.

Y. Hirose et al., "Polarity-Dependent Memory Switching and Behavior of Ag Dendrite in Ag-Photodoped Amorphous As2-s3 Films", *J. Appl. Phys.*, vol. 47, No. 6, Jun. 1976, pp. 2767-2772.

A.V. Kolobov et al., "Photodoping of Amorphous Chalcogenides by Metals", *Advances in Physics*, 1991, vol. 40, No. 5, pp. 625-684.

M. Mitkova et al., "Dual Chemical Role of Ag in an Additive in Chalcogenide Glasses", *Physical Review Letters*, vol. 83, No. 19, pp. 3848-3851.

K. L. Tai et al., "Bilevel High Resolution Photolithographic Technique for Use with Wafers Stepped and/or Reflecting Surfaces", *J. Vac. Sci. Technol.*, vol. 16, No. 6, Nov./Dec. 1979, pp. 1977-1979.

K. L. Tai et al., "Inorganic Resist Systems for VLSI Microlithography", Bell Laboratories, pp. 9-35.

K. L. Tai et al., "Submicron Optical Litography Using an Inorganic Resist/Polymer Bilevel Scheme" *J. Vac. Sci. Technol.*, vol. 17, No. 5, Sep./Oct. 1980, pp. 1169-1176.

A. Yoshikawa et al., "Angstroms Resolution in Se-Ge Inorganic Photoresists", *Japanese Journal of Applied Physics*, vol. 20, No. 2, Feb. 1981, pp. L81-L83.

A. Yoshikawa, et al., "Dry Development of Se-Ge Inorganic Photoresist", *Appl. Phys. Lett.*, vol. 36, No. 1, Jan. 1980, pp. 107-109.

A. Yoshikawa et al., "A New Inorganic Electron Resist of High Contrast", *Appl. Phys. Lett.*, vol. 31, No. 3, Aug. 1977, pp. 161-163.

A. Yoshikawa et al., "A Novel Inorganic Photoresist Utilizing Ag Photodoping in Se-Ge Glass Films", *Appl. Phys. Lett.*, vol. 29, No. 10, Nov. 15, 1976, pp. 677-679.

* cited by examiner

PROGRAMMABLE CONDUCTOR MEMORY CELL STRUCTURE AND METHOD THEREFOR

CROSS-REFERENCE TO RELATED APPLICATIONS

This is a divisional of U.S. patent application Ser. No. 10/787,123, filed Feb. 27, 2004 now U.S. Pat. No. 7,132,675, which is a continuation of U.S. patent application Ser. No. 10/121,790, filed Apr. 10, 2002, now U.S. Pat. No. 6,864,500, and is related to U.S. patent application Ser. No. 10/618,824, filed Jul. 14, 2003, now U.S. Pat. No. 6,838,307, the disclosures of which are incorporated herein by reference in their entireties.

FIELD OF THE INVENTION

This invention relates generally to memory devices for integrated circuits and more particularly to an anode contact for a programmable conductor random access memory (PCRAM) cell.

BACKGROUND OF THE INVENTION

The digital memory chip most commonly used in computers and computer system components is the dynamic random access memory (DRAM), wherein voltage stored in capacitors represents digital bits of information. Electric power must be supplied to the capacitors to maintain the information because, without frequent refresh cycles, the stored charge dissipates, and the information is lost. Memories that require constant power are known as volatile memories.

Non-volatile memories do not need frequent refresh cycles to preserve their stored information, so they consume less power than volatile memories. The information stays in the memory even when the power is turned off. There are many applications where non-volatile memories are preferred or required, such as in lap-top and palm-top computers, cell phones or control systems of automobiles. Non-volatile memories include magnetic random access memories (MRAMs), erasable programmable read only memories (EPROMs) and variations thereof.

Another type of non-volatile memory is the programmable conductor or programmable metallization memory cell, which is described by Kozicki et al. in (U.S. Pat. No. 5,761,115; No. 5,914,893; and No. 6,084,796) and is incorporated by reference herein. The programmable conductor cell of Kozicki et al. (also referred to by Kozicki et al. as a "metal dendrite memory") comprises a glass ion conductor, such as a chalcogenide-metal ion glass, and a plurality of electrodes disposed at the surface of the fast ion conductor and spaced a distance apart from one another. The glass/ion element shall be referred to herein as a "glass-electrolyte" or, more generally, "cell body." When a voltage is applied across the anode and cathode, a non-volatile conductive pathway (considered a sidewall "dendrite" by Kozicki et al.) grows from the cathode through or along the cell body towards the anode. The growth of the dendrite depends upon applied voltage and time; the higher the voltage, the faster the growth rate; the longer the time, the longer the dendrite. The dendrite can retract, re-dissolving the metal ions into the cell body, by reversing the polarity of the voltage at the electrodes.

In the case of a dielectric material, programmable capacitance between electrodes is programmed by the extent of dendrite growth. In the case of resistive material, programmable resistances are also programmed in accordance with the extent of dendrite growth. The resistance or capacitance of the cell thus changes with changing dendrite length. By completely shorting the glass electrolyte, the metal dendrite can cause a radical change in current flow through the cell, defining a different memory state.

For the proper functioning of a memory device incorporating such a chalcogenide-metal ion glass element, it is important that growth of the conductive pathway have a reproducible relationship to applied voltage. For device operation, multiple cells across an array should ideally have a consistent response to the signals they receive.

The current invention addresses the issue of consistent memory cell response by ensuring a uniform supply of metal ions for formation of a conductive pathway under applied voltage.

SUMMARY OF THE INVENTION

A programmable conductor memory cell for an integrated circuit is disclosed. In accordance with one aspect of the invention, the memory cell includes a memory cell body, formed from a glass electrolyte element having metal ions disposed therein which fills a cell body via in a first insulating layer. A cathode is in contact with the cell body at the bottom of the cell body via. The second insulating layer, which overlies the first insulating layer and the cell body, has an anode via therein that is positioned concentrically over the memory cell body. The anode via is filled with anode material so that the anode contacts only a central portion of the anode surface of the memory cell body, which central portion is spaced inwardly from the sidewall of the memory cell body.

In a preferred embodiment, the anode via is lined with a spacer, preferably of insulating material, to ensure coverage of the sidewall edge of the memory cell body. In another embodiment, the anode via is formed using a mask with an opening smaller in width than the memory cell body and having the opening arranged concentrically over the memory cell body. In this way the sidewall edge of the memory cell body is covered by the second insulating layer.

The memory cell body can comprise a chalcogenide glass electrolyte material, preferably germanium-selenium, containing metal ions such as silver.

BRIEF DESCRIPTION OF THE DRAWINGS

These and other aspects of the invention will be better understood from the description below and the appended drawings, which are meant to illustrate and not to limit the invention, and in which.

DETAILED DESCRIPTION OF THE INVENTION

For proper functioning of a "programmable conductor" memory cell device, incorporating a glass electrolyte element with an adjustable conductivity, it is important that the conductive pathway growth in response to a particular applied voltage occurs reproducibly and consistently across an array. Low voltages cause slow growth, whereas higher voltages result in faster growth of the conductive path. The amount of growth in a given switching time depends, in part, on the availability of metal ions. Therefore, it is important that the cations come from a controlled source, such as from the solid solution of the cell body or glass electrolyte, which supplies an amount of cations proportional to the concentration therein and to the electric field. If additional cations are supplied from other, less reliable sources, the amount of cations may not be directly and reproducibly related to the strength of the electric field or switching time.

For example, the interface between the cell body sidewall and the surrounding insulating layer can provide a diffusion path for metal atoms and ions. When a metal anode layer (e.g., silver) is in contact with the edge (shown in FIG. 1B as 115) of the cell body sidewall, i.e., where the sidewall makes contact with the anode surface, there is additional diffusion of metal cations along the sidewall, through the interface, to the growing conductive pathway. If the anode via is designed to have the same width as the cell body via, even slight variations in mask registration can result in large differences in the contact area between the anode and the edge of the cell body sidewall, regardless of conventional mechanisms to minimize the effect of mask misalignment. These differences in contact area lead to differences in the metal supply through the cell body/insulator interface to the growing conductive pathway. Thus, the extent of conductive pathway formation would depend not just on applied voltage and/or switching time, but also on the amount of metal leakage along the sidewall. Accordingly, the preferred embodiments provide means for avoiding differential contact area between the anode and the edge of the glass electrolyte element.

Figure 1A:
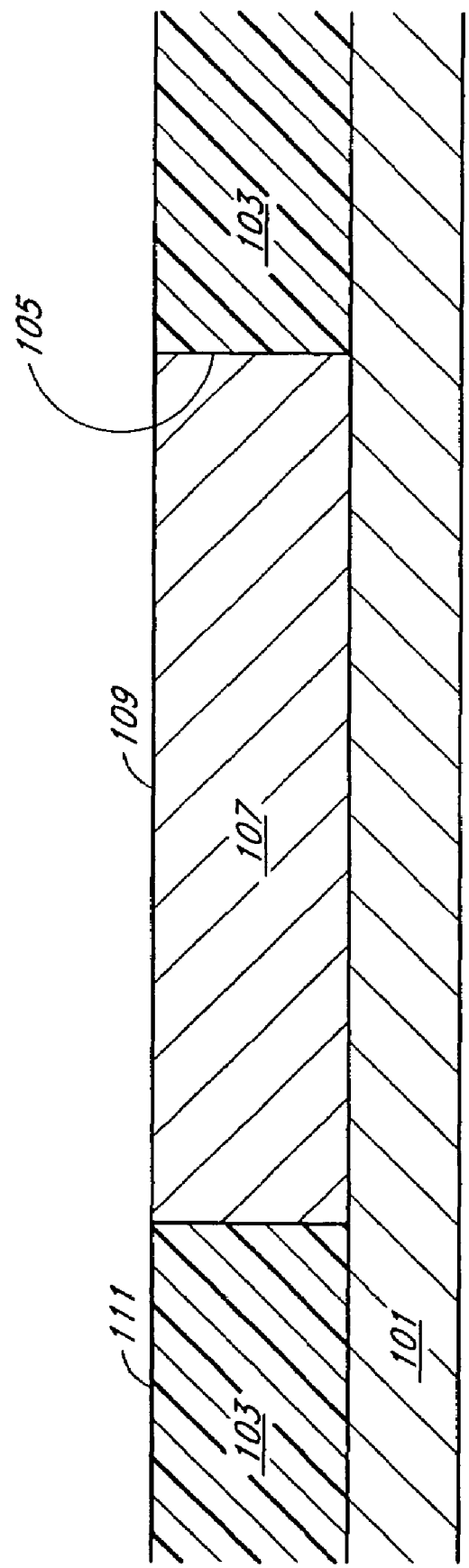
FIG. 1A is a cross section of a partially fabricated programmable conductor memory cell for an integrated circuit, constructed in accordance with a preferred embodiment of the present invention.

A preferred embodiment of the current invention can be described beginning with reference to FIG. 1A, wherein the first components of a simplified programmable conductor memory cell for an integrated circuit are shown. A cathode layer 101, which is connected to the negative pole of a power supply, is shown. Preferably, the cathode layer 101 comprises tungsten (W). An insulating layer 103, preferably silicon nitride ($Si_3N_4$), is deposited over the cathode layer 101. In other arrangements, it will be understood that the thick planarized insulating layer 103 can comprise a form of silicon oxide, such as TEOS or BPSG, although it is preferred to define the sidewall with a material that prevents the diffusion of metal between devices. The thickness of the insulating layer 103 is preferably between about 10 nm and 200 nm, more preferably between about 25 nm and 100 nm and most preferably about 50 nm. A cell body via 105 is etched through the insulating layer 103, opening a window to the cathode layer 101, using standard patterning and etching techniques. The width of the cell body via 105 is preferably between about 100 nm and 500 nm, more preferably between about 200 nm and 300 nm, and most preferably about 250 nm. The cell body via 105 is filled with a glass electrolyte 107 (sometimes referred to in the literature as a Glass Fast Ion Diffusion or GFID element). The illustrated cell body preferably includes a chalcogenide glass, more preferably a glass comprising germanium and selenium (Ge—Se) and most preferably, $Ge_4Se_6$, $Ge_3Se_7$ or $Ge_2Se_8$, and additionally includes metal ions. The actual ratios of elements in the cell body 107 can vary and more complicated structures for the cell body 107 are also contemplated, one of which is illustrated in FIG. 1C and discussed below. Once the cell body via 105 is filled, the top surface 109 of the Ge—Se 107 is made level with the top surface 111 of the insulating layer 103, preferably by chemical mechanical planarization. Preferably the height of the programmable conductor memory cell body between the cathode surface and the anode surface is in the range of about 25 nm to 100 nm.

Figure 1B:
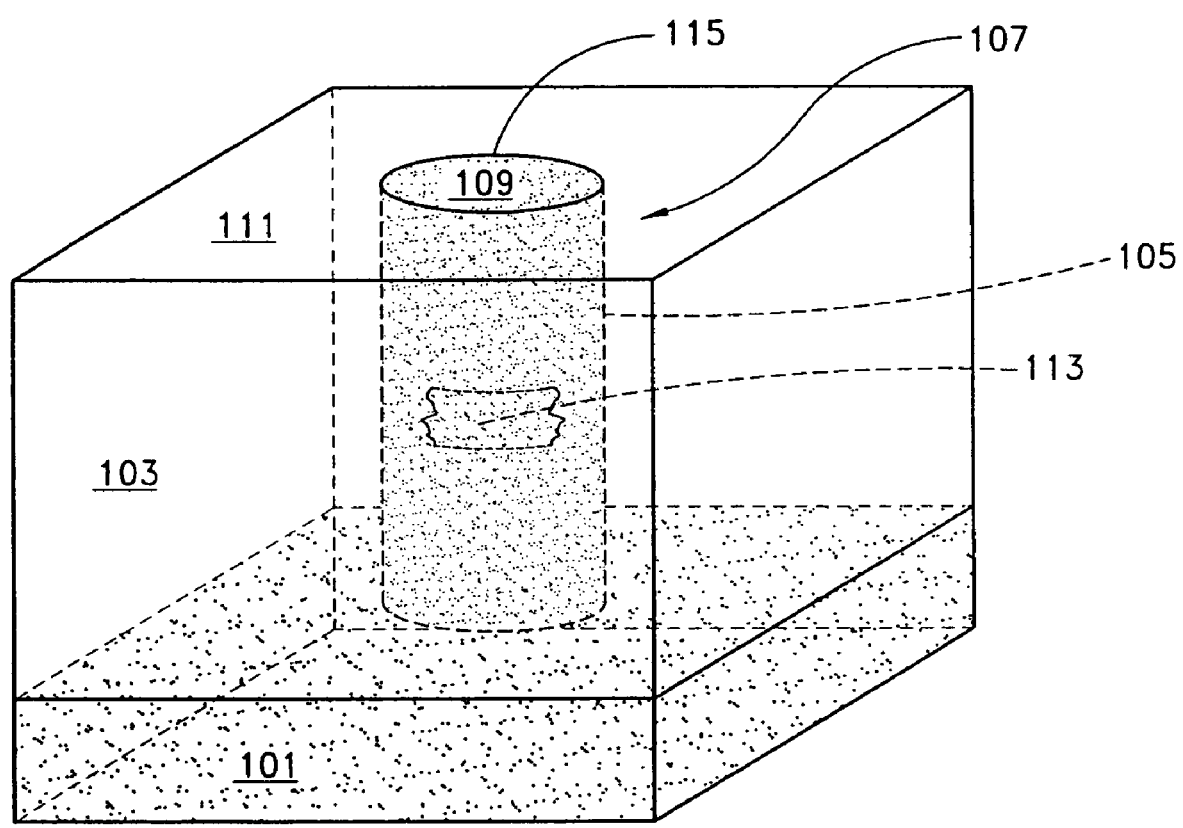
FIG. 1B is a perspective view of the partially fabricated programmable conductor memory cell of FIG. 1A.
Figure 1C:
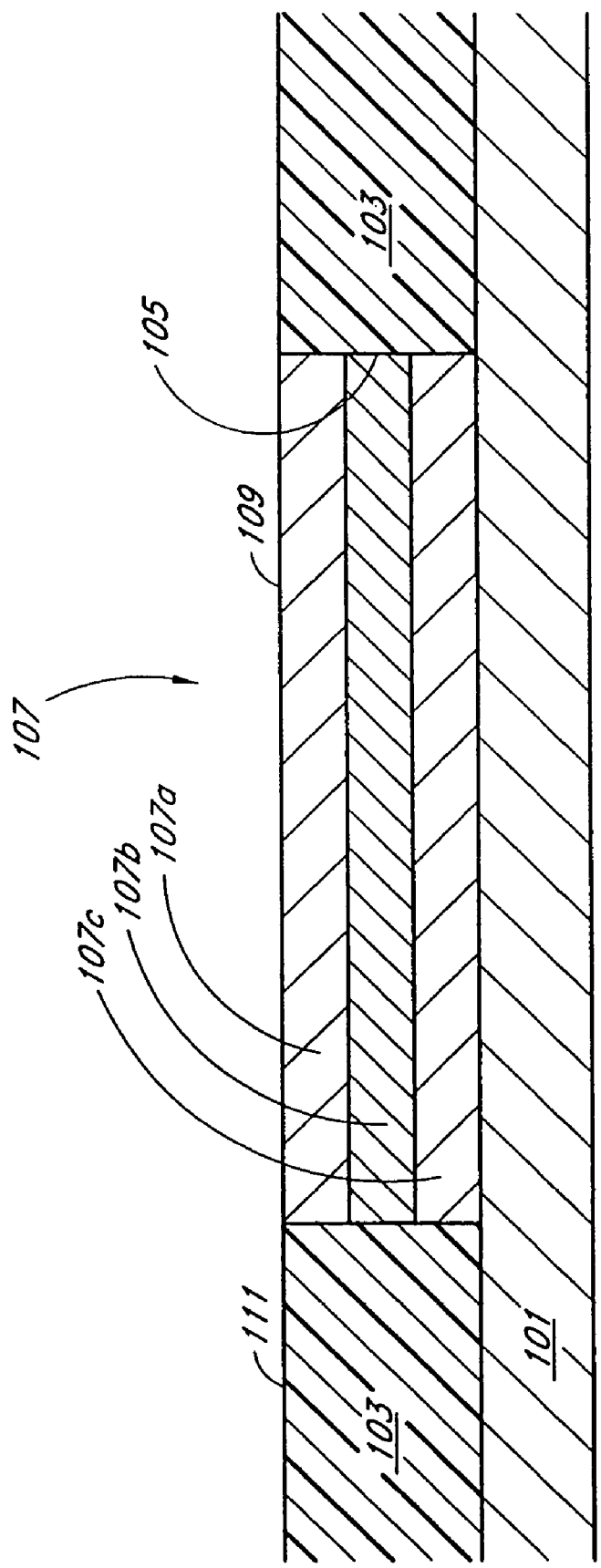
FIG. 1C is a cross section of a partially fabricated memory cell for and integrated circuit, constructed in accordance with another embodiment of the present invention.

Some aspects of the glass electrolyte element that are helpful for understanding the embodiments of the current invention are shown in FIG. 1B, a perspective view of the first components of the programmable conductor memory cell already seen in cross section in FIG. 1A. The glass electrolyte element 107 is shown embedded in the insulating layer 103 and making contact with an underlying cathode layer 101. The sidewall 113 of the glass electrolyte element is defined as the outer, cylindrical (in the illustrated embodiment) surface of the element, which is defined by the surrounding via wall 105. The edge 115 of the sidewall 113 is the intersection of the glass electrolyte element sidewall 113 and the top surface 109. In the illustrated embodiment, the edge 115 of the sidewall 113 has the form of a circle.

In the illustrated embodiment, in order to supply metal ions to the Ge—Se glass, a thin layer (not shown) of metal or a combination of metals, including metal(s) from Group IB or Group IIB, more preferably, silver, copper or zinc, is preferably deposited over a recessed top surface 109 of the fast ion conducting element and metal ions are driven into the glass. The thickness of the metal layer is between about 2 nm and 10 nm, more preferably between about 3 nm and 8 nm and most preferably about 5 nm. For example, silver (Ag) ions can be driven into the Ge—Se material by exposing an overlying Ag layer to ultraviolet radiation with a wavelength less than 50 nm or through plasma treatment. Preferably, there is enough silver available in the layer to form a ternary compound, silver germanium selenide, which is a stable amorphous material. Silver constitutes preferably between about 20% and 50%, more preferably between about 25% and 35% and most preferably about 30% (atomic percent) of the compound. The ternary compound is a glass electrolyte material. The amount of silver formed over the glass is preferably selected to be completely consumed by the photodissolution process. After formation of the glass electrolyte material, the top surface 111 can be planarized again to remove any remaining metal.

In other arrangements, metal for the programmable conductor memory is supplied by other means. For example, a layer containing a mixture of tungsten-silver of about 50%-50% by weight can be co-sputtered onto the glass electrolyte as a source of silver ions. In still other arrangements, the metal and glass material can be co-sputtered or deposited from a source that contains all species, so no metal deposition and drive-in steps are needed.

FIG. 1C illustrates another arrangement of the cell body 107, wherein like reference numerals are employed to refer to like parts among the different embodiments. In this arrangement, the cell body 107 includes three layers, comprising a first Ge—Se layer 107a (e.g., $Ge_4Se_6$), a metal selenide layer 107b (e.g., $Ag_2Se$) and a second Ge—Se layer 107c (e.g., $Ge_4Se_6$). The skilled artisan will appreciate that the embodiments discussed below are equally applicable to forming electrodes over the cell body 107 of FIG. 1A, FIG. 1B or of any of a variety of other programmable conductor arrangements. In the illustrated embodiment of FIG. 1C, the intermediate layer 107b provides metal to the cell body 107 for formation of conductive pathways under the influence of applied electrical fields. The structure can be formed by blanket deposition and etch or by first forming and then filling a via. In either case, the sidewall of the insulator surrounding the cell body is referred to as a "via" herein.

Regardless of how formed, the cell body or glass electrolyte element 107, including metal ions diffused therein, serves as the memory cell body.

Figure 2:
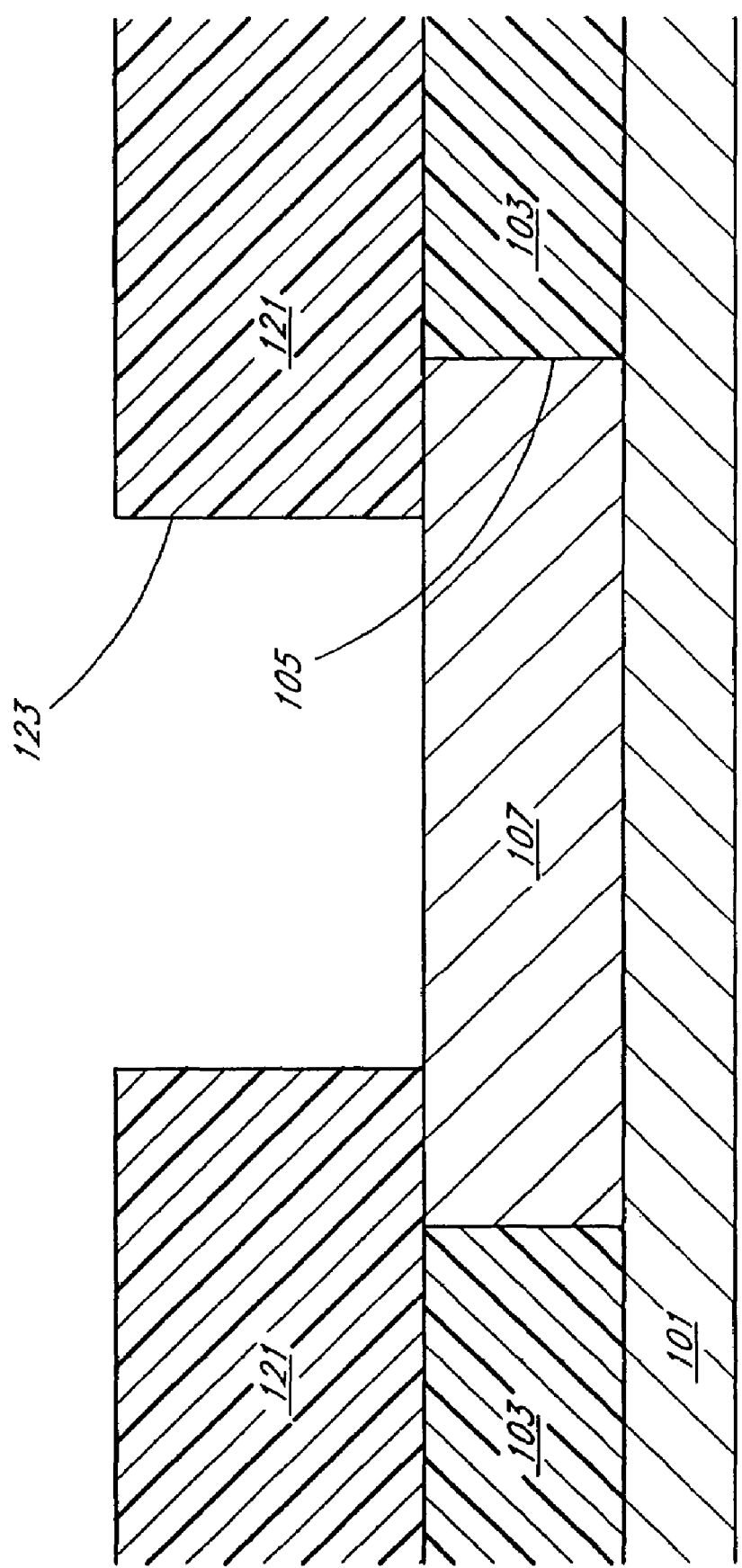
FIG. 2 is a cross section showing an embodiment of the current invention wherein an anode via has a smaller diameter than the memory cell body and is formed concentrically thereover.

With reference to FIG. 2, a second insulating layer 121, preferably silicon nitride, is deposited over the first insulating layer 103. The thickness of the second insulating layer 121 is preferably between about 50 nm and 200 nm, more preferably between about 80 nm and 150 nm and most preferably about 100 nm. An anode via 123 is etched through the $Si_3N_4$ directly over the cell body via, exposing the glass electrolyte element 107.

In some arrangements, metal deposition and drive-in steps can be performed after etching the anode via instead of before deposition of the second insulating layer 121 as described above.

In the embodiment of FIG. 2, the width of the anode via 123 in insulating layer 121 is smaller than the width of the cell body 107 in insulating layer 103, preferably by between about 10 nm and 100 nm and more preferably by between 10 nm and 60 nm. The anode via 123 is positioned over the cell body 107 roughly concentrically, that is, so that the sidewall of anode via 123 is spaced from the sidewall of cell body 107 all the way around, and only a central portion of the cell body 107 is exposed.

Figure 3:
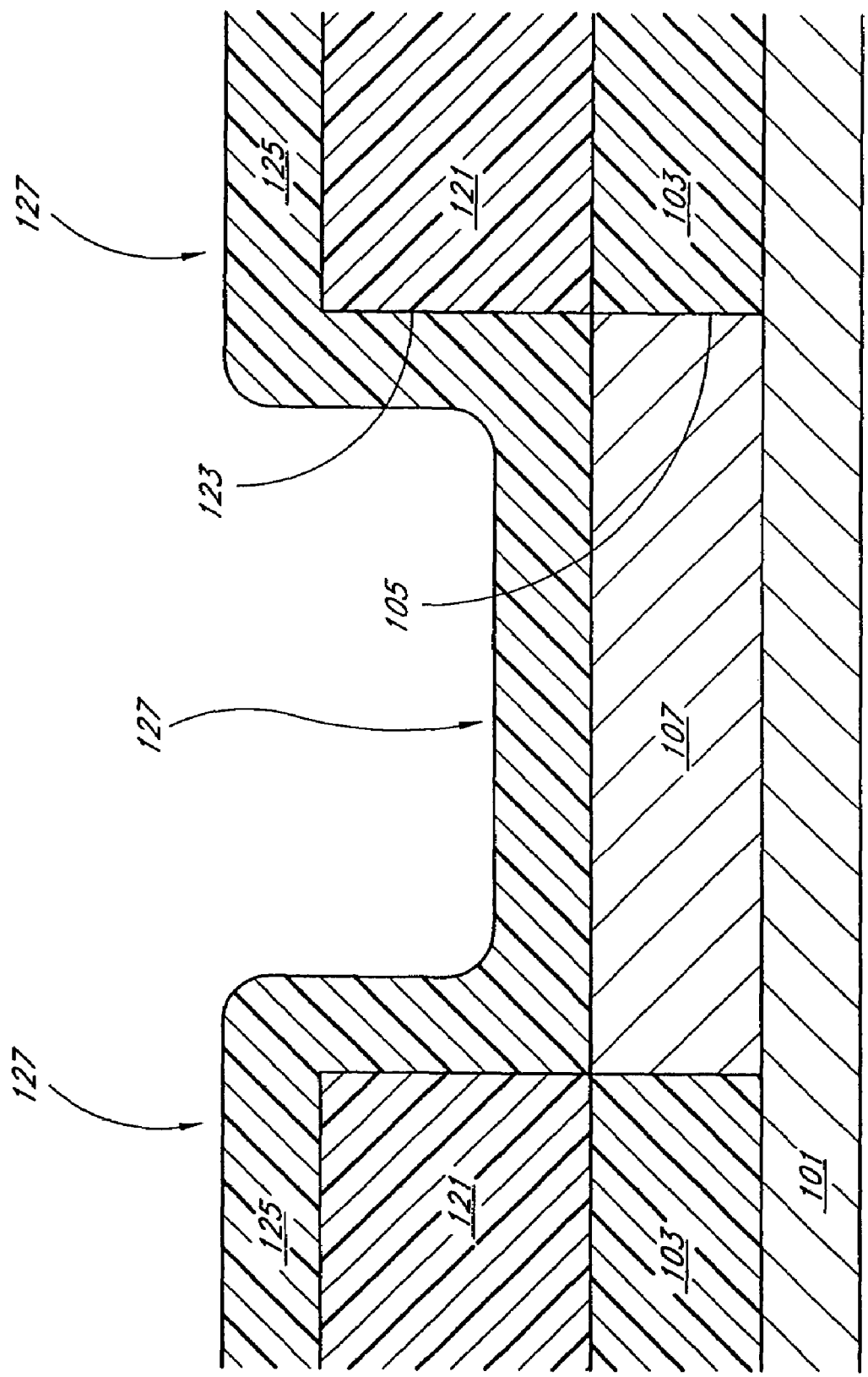
FIG. 3 is a cross section showing the programmable conductor memory cell of FIG. 1A after deposition of an insulating layer, formation of an anode via therein and deposition of a conformal layer of silicon nitride, according to another embodiment of the current invention.

Referring now to FIG. 3, the anode via 123 and the cell body via 105 have about the same size and are aligned directly over one another, in accordance with another embodiment of the invention. Methods known in the art can be used to avoid mask misalignment problems. Additionally, a thin blanket layer 125 of spacer material, preferably an insulating material and most preferably $Si_3N_4$, is deposited conformally over the insulating layer 121 and the anode via 123. The skilled artisan will appreciate, in view of the disclosure herein, that the spacer material need not be the same as the surrounding insulating layer, although it is preferably a barrier to metal diffusion, particularly to diffusion of the fast diffusing element incorporated into the cell body 107 and anode to be formed. The thickness of the spacer layer 125 is preferably between about 5 nm and 50 nm and more preferably between about 5 nm and 30 nm.

Figure 4:
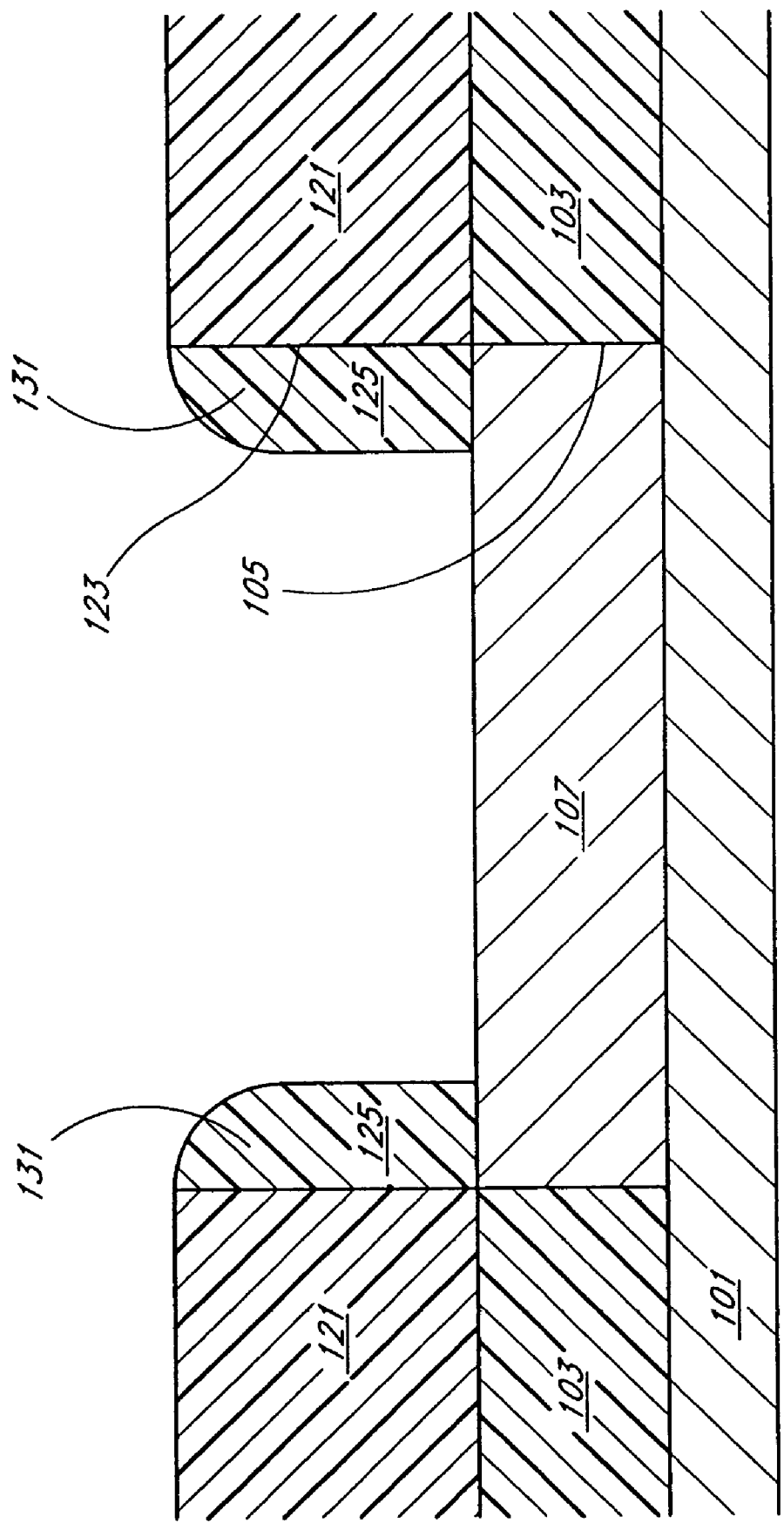
FIG. 4 is a cross section showing the programmable conductor memory cell of FIG. 3 after a spacer etch has been performed.

Referring to FIG. 4, a spacer etch is performed, preferably by reactive ion etching (RIE), wherein horizontal portions 127 (FIG. 3) of the spacer layer 125 are removed preferentially, leaving vertical portions of the spacer layer 125 relatively unaffected. FIG. 4 shows the vertical portions of the spacer layer 125 that remain after RIE, leaving a spacer 131 lining vertical surfaces of the anode via 123. It will be understood that the spacer 131 forms a continuous lining around the sidewall of the anode via 123. In the illustrated embodiment, the spacer 131 is a cylindrical annulus with a rounded top edge, whose outer side surface is in contact with the sidewall of the anode via 123.

Figure 5:
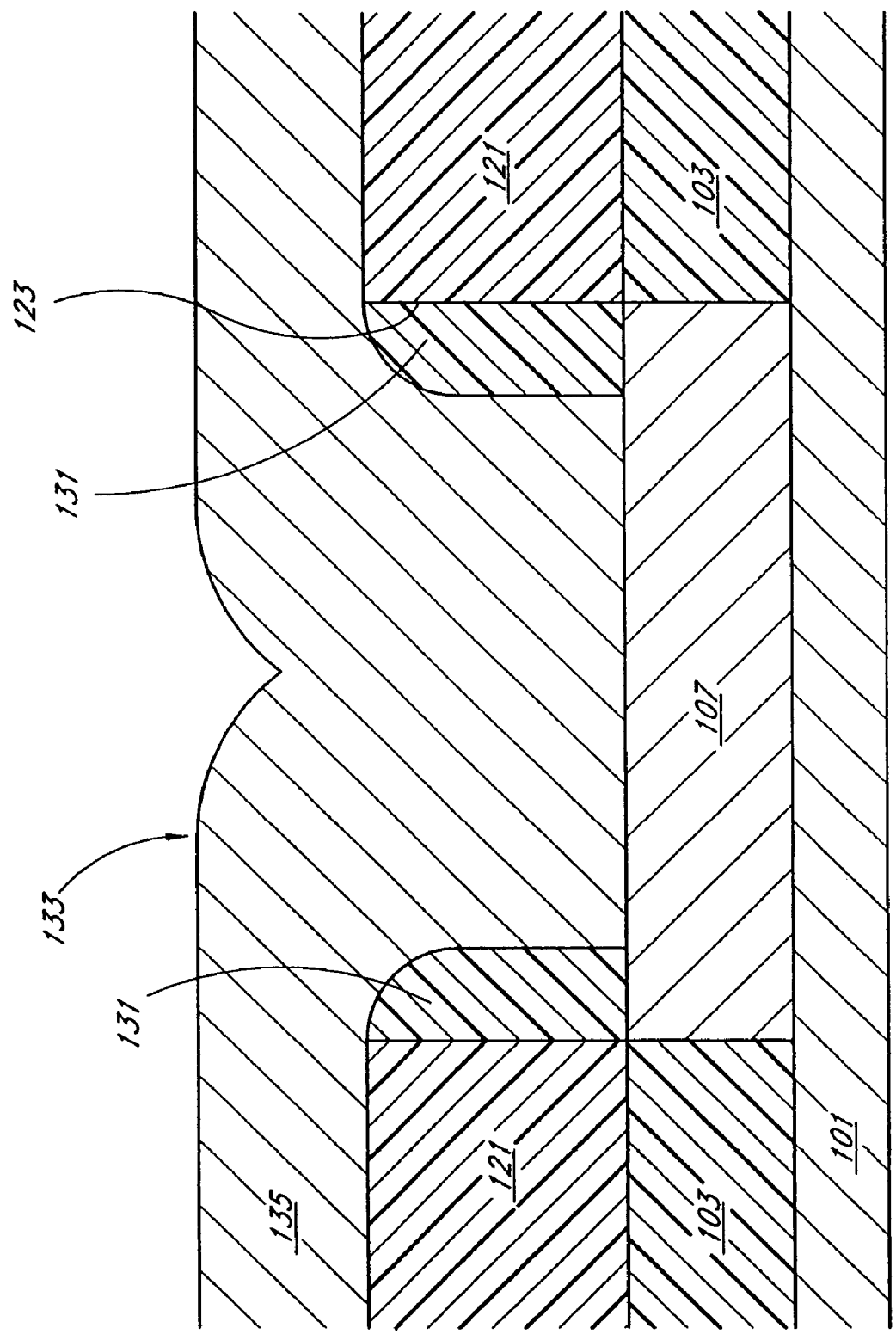
FIG. 5 is a cross section showing the structure of FIG. 3, after a metal layer has been deposited into the spacer-lined anode via.

Next, as shown in FIG. 5, a metal anode layer 133, preferably including a metal or combination of metals from Group IB or Group IIB, more preferably copper or zinc and most preferably silver, is deposited. Preferably, the metal anode layer 133 is deposited so that it fills the anode via 123 and forms a portion 135 overlying the second insulating layer 121 all as one contiguous body of material. The overlying portion 135 is subsequently patterned and etched as desired, depending upon the circuit design of the memory array.

In FIG. 5, the metal deposition is shown for an anode via 123 with a spacer 131. The anode via filling and overlying anode layer can be deposited in this same manner for the embodiment described with respect to FIG. 2, having an anode via 123 that is narrow (compared to the cell body 107) without a spacer. In both the embodiment of FIG. 2 and the embodiment of FIG. 4, the anode makes contact with only a central portion of the memory cell body and not the sidewall edges.

When a voltage is applied across the lower electrode 101 and upper electrode 133, a conductive path forms between the cathode 101 (i.e., the electrode connected to the negative pole of the power supply) and the anode 133 (i.e., the electrode connected to the positive pole of the power supply). Without being limited by theory, it is believed that the conductive path grows by precipitation of cations (e.g., silver cations) from the memory cell body 107. Changes in the extent of the conductive path affect the overall resistance of the device. The conductive path tends to remain intact when the voltage is removed.

For a binary programmable conductor memory device, the memory has two basic states: 0 and 1. When there is no conductive path, the memory cell has high electrical resistance and reads as 0. When the conductive path shorts the memory cell body 107, from the cathode 101 to the anode 133, the resistance is low and the memory cell reads as 1. The change in resistance of the memory cell with and without a conductive path can be as much as two orders of magnitude, e.g., a change from Megaohms to milliohms. Reversing the polarity of the voltage reverses the formation of the conductive path, redissolving metal cations into the glass.

Alternatively, the memory cell can be programmed into as many as 3 or 4 states by setting the extent of the conductive path growth. These changes can be detected easily by the bit lines and word lines in a memory array, such that changing the extent of the conductive path can serve to change the state of the memory bit.

Thus, in one embodiment of the current invention, an anode via is made smaller than the cell body via so that the overlying insulator layer covers the cell body/insulator interface. The smaller anode vias are positioned so that their bottoms make contact only with the cell body and do not extend to the cell body/insulator interface. In another embodiment, a spacer prevents contact between the anode material and the cell body/insulator interface by covering the interface with spacer material near the outer edge of the anode via bottom. The preferred embodiments thus give reliable control to the spacing between the edge of the anode and the edge of the memory cell body or GFID material. These structures ensure that the anode cations that precipitate out to form the conductive path are those that were intentionally and controllably provided to the glass electrolyte material, whether by photodissolution, separate metal-containing layer (see FIG. 1C), co-deposition or any other manner of metal doping. Silver content dissolved within a GeSe glass, for example, is self limiting at about 30 atm %, thus providing a reliably consistent source of diffusion ions for selectively forming the conductive path. For a given cation (e.g., Ag) concentration in solution, this provides conductive pathway formation reproducibly dependent upon voltage applied across the electrodes and/or switching time.

Although the embodiments of the invention have been described in the context of a vertically built device, one of skill in the art will recognize that this is not the only possible configuration or method for constructing a programmable conductor memory cell.

What is claimed as new and desired to be protected by Letters Patent of the United States is:

1. A memory cell, comprising:
    a first insulating layer having a cell body via;
    a memory cell body comprising a chalcogenide glass electrolyte having at least one of silver, copper and zinc ions diffused therein, the memory cell body being contained within the cell body via and defining a sidewall where the memory cell body and the first insulating layer make contact;
    a first electrode in contact with the memory cell body;
    a second insulating layer over the first insulating layer and defining an electrode via to the memory cell body;
    a second electrode in contact with a top surface of the memory cell body and formed in the electrode via;
    wherein the electrode via has a width about the same as a width of the memory cell body, and the electrode via is lined with a spacer that covers a sidewall edge of the memory cell body, such that the second electrode contacts the top surface of the memory cell body without contacting the sidewall of the memory cell body.

2. The memory cell of claim 1, wherein the electrode via is filled with metal to form the second electrode.

3. The memory cell of claim 1, wherein the first electrode comprises tungsten.

4. The memory cell of claim 1, wherein the first electrode is a cathode.

5. The memory cell of claim 1, wherein the second electrode is an anode.

6. The memory cell of claim 1, wherein the spacer comprises an insulating material.

7. The memory cell of claim 1, wherein the spacer has a thickness extending into the electrode via between about 5 nm and 30 nm.

8. The memory cell of claim 1, wherein the spacer comprises silicon nitride.

9. A memory cell, comprising:
    a first insulating layer disposed over a first electrode;
    a chalcogenide glass electrolyte having at least one of silver, copper and zinc ions diffused therein, the chalcogenide glass electrolyte being in contact with the first electrode through an opening in the first insulating layer;
    a second insulating layer over the first insulating layer having an electrode via disposed over the chalcogenide glass electrolyte, the electrode via being lined with at least one spacer that covers a sidewall of the electrode via; and
    a second electrode formed in the electrode via and in contact with the chalcogenide glass electrolyte.

10. The memory cell of claim 9, wherein the electrode via has a width about the same as a width of the chalcogenide glass electrolyte.

11. The memory cell of claim 9, wherein the first electrode comprises tungsten.

12. The memory cell of claim 9, wherein the glass electrolyte comprises germanium-selenide.

13. The memory cell of claim 9, wherein the glass electrolyte has silver ions diffused therein.

14. The memory cell of claim 9, wherein the glass electrolyte has copper ions diffused therein.

15. The memory cell of claim 9, wherein the glass electrolyte has zinc ions diffused therein.

16. The memory cell of claim 9, wherein the spacer comprises silicon nitride.

17. A memory cell structure, comprising:
    a germanium-selenide glass electrolyte having at least one of silver, copper and zinc ions diffused therein;
    insulating material over the glass electrolyte defining an electrode via to the glass electrolyte, the electrode via being lined with at least one spacer having a rounded top edge that covers a portion of a top surface of the glass electrolyte; and
    an electrode in contact with the glass electrolyte and formed in the electrode via such that the electrode contacts the glass electrolyte without contacting the portion of the top surface of the glass electrolyte covered by the at least one spacer.

18. The memory cell of claim 17, wherein the spacer comprises an insulating material.

19. The memory cell of claim 17, wherein the spacer has a thickness extending into the electrode via between about 5 nm and 30 nm.

20. The memory cell of claim 17, wherein the glass electrolyte has silver ions diffused therein.

* * * * *